(12) United States Patent
Tetsuka et al.

(10) Patent No.: US 7,525,804 B2
(45) Date of Patent: Apr. 28, 2009

(54) SEMICONDUCTOR DEVICE AND METHOD OF MANUFACTURING THE SAME

(75) Inventors: Takashi Tetsuka, Kanagawa (JP); Hiroki Yamamoto, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 309 days.

(21) Appl. No.: 11/060,495

(22) Filed: Feb. 18, 2005

(65) Prior Publication Data

US 2005/0180117 A1 Aug. 18, 2005

(30) Foreign Application Priority Data

Feb. 18, 2004 (JP) ............................ 2004-041946
Jan. 26, 2005 (JP) ............................ 2005-018882

(51) Int. Cl.
*H05K 7/20* (2006.01)
*B21D 53/02* (2006.01)

(52) U.S. Cl. .................................. 361/718; 29/890.035

(58) Field of Classification Search ................. 361/718; 29/890.035

See application file for complete search history.

(56) References Cited

U.S. PATENT DOCUMENTS

| | | | | |
|---|---|---|---|---|
| 3,489,203 A | * | 1/1970 | Fischell | 165/274 |
| 5,182,632 A | * | 1/1993 | Bechtel et al. | 257/713 |
| 5,591,034 A | * | 1/1997 | Ameen et al. | 439/91 |
| 5,834,337 A | * | 11/1998 | Unger et al. | 438/122 |
| 5,875,096 A | * | 2/1999 | Gates | 361/704 |
| 5,897,917 A | * | 4/1999 | Hinshaw et al. | 422/258 |
| 6,029,740 A | * | 2/2000 | Lee et al. | 165/76 |
| 6,049,458 A | * | 4/2000 | Lee et al. | 361/705 |
| 6,104,090 A | * | 8/2000 | Unger et al. | 257/729 |
| 6,305,174 B1 | * | 10/2001 | Binneberg et al. | 62/6 |
| 6,332,268 B1 | * | 12/2001 | Imanishi et al. | 29/832 |
| 6,424,533 B1 | * | 7/2002 | Chu et al. | 361/719 |
| 6,644,395 B1 | * | 11/2003 | Bergin | 165/185 |
| 6,829,145 B1 | * | 12/2004 | Corrado et al. | 361/704 |
| 6,935,420 B1 | * | 8/2005 | Dong et al. | 165/185 |
| 7,063,136 B2 | * | 6/2006 | Yu et al. | 165/185 |
| 7,068,512 B2 | * | 6/2006 | Lee et al. | 361/704 |
| 2003/0122242 A1 | * | 7/2003 | Takeuchi | 257/697 |
| 2004/0180515 A1 | * | 9/2004 | Okawa | 438/463 |
| 2004/0227230 A1 | * | 11/2004 | Chou | 257/712 |
| 2005/0099776 A1 | * | 5/2005 | Xue et al. | 361/700 |
| 2006/0087015 A1 | * | 4/2006 | Yuan et al. | 257/678 |

FOREIGN PATENT DOCUMENTS

| JP | 60030994 A | * | 2/1985 |
|---|---|---|---|
| JP | 62046273 A | * | 2/1987 |
| JP | 2001-210761 A | | 8/2001 |

* cited by examiner

*Primary Examiner*—Anatoly Vortman
(74) *Attorney, Agent, or Firm*—Sughrue Mion, PLLC (57) ABSTRACT

A semiconductor package is provided with a low thermal conductivity plate that covers an entire upper surface of a heat dissipating component, by which heat dissipation from the heat dissipating component can be inhibited during a reflow process. Accordingly, sufficient heat can be transmitted to solder balls, so as to heat the solder balls up to a desired temperature. As a result, the semiconductor package and a substrate can be fully bonded via the solder balls, and thereby an excellent mounting performance is achieved.

2 Claims, 10 Drawing Sheets

SEMICONDUCTOR DEVICE AND METHOD OF MANUFACTURING THE SAME

This application is based on Japanese patent application No. 2004-041946 and Japanese patent application No. 2005-018882, the content of which is incorporated hereinto by reference.

BACKGROUND OF THE INVENTION

1. Field of the Invention

The present invention relates to a semiconductor device provided with a heat spreader, and a method of manufacturing such semiconductor device.

2. Related Art

Along with the recent rapid diffusion of the internet and intranet, semiconductor devices used therein are coming to be smaller in dimensions, yet to have more number of pins and higher outputs. In addition, high reliability is one thing constantly required from a semiconductor device. Here, reliability of a semiconductor device significantly depends on an operating temperature, and a lower operating temperature facilitates the semiconductor device to achieve higher reliability. Accordingly, it is essential to grant a better thermal performance to a semiconductor device, in order to make the most of its functional capability without compromise in reliability. From such viewpoint, techniques for lowering a thermal resistance of a semiconductor device are being developed, aiming at upgrading the reliability of the semiconductor device.

JP-A Laid Open No. 2001-210761 discloses a technique of adhering or burying a metal plate serving as a heat spreader to or in a surface of a semiconductor device to thereby improve heat dissipation thereof, and to thus lower the thermal resistance of the semiconductor device.

SUMMARY OF THE INVENTION

Figure 10:
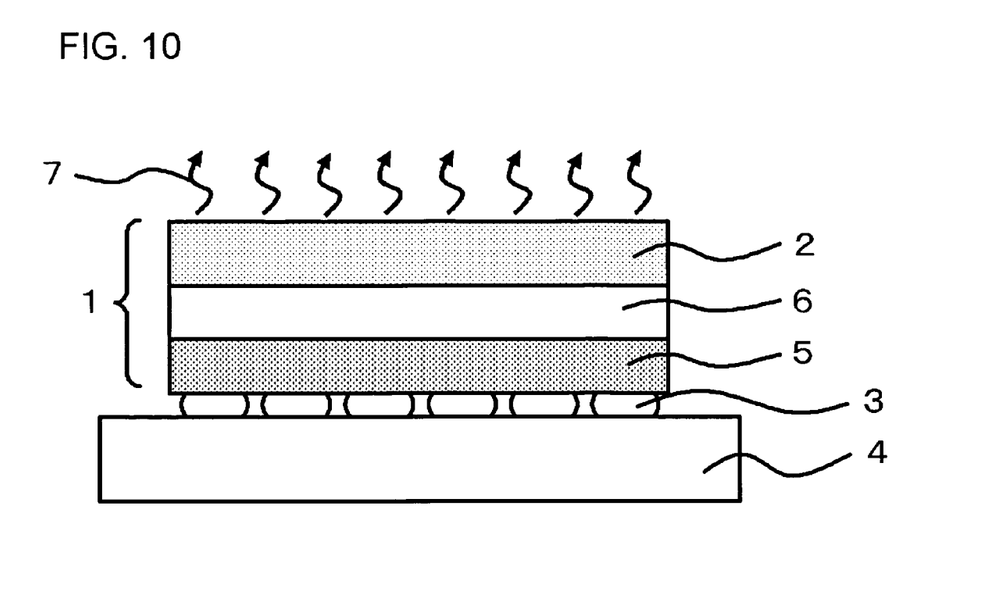
FIG. 10 is a schematic cross-sectional view showing a structure of a conventional semiconductor device.

However, it has now been discovered that a semiconductor device having its thermal resistance lowered by the foregoing technique is prone to incur the following disadvantage as shown in FIG. 10. When a semiconductor package 1 including an elements layer 5, a silicon substrate 6 and a heat spreader 2 is mounted on a substrate 4, heat 7 necessary for a reflow soldering process dissipates through a heat spreader 2. Therefore, a temperature of a solder ball 3 does not rise sufficiently, which results in a defective mounting.

According to the present invention, there is provided a semiconductor device to be mounted on a substrate with a solder ball, comprising a heat dissipating component; and a heat dissipation preventing component that is removable formed on the heat dissipating component so as to inhibit heat dissipation from the heat dissipating component.

According to the present invention, the heat dissipation preventing component formed when mounting the semiconductor device on a substrate inhibits heat dissipation from the heat dissipating component on the semiconductor chip during the mounting process of the semiconductor device on the substrate. Accordingly, a temperature of a substrate bonding material such as a solder ball can be raised to a sufficient level when mounting the semiconductor device on a substrate, and resultantly a desired mounting performance can be achieved with the semiconductor device. Also, since the heat dissipation preventing component can be removed after mounting the semiconductor device on the substrate, the semiconductor device can be obtained with a lower thermal resistance, hence with an excellent heat dissipation characteristic.

According to the present invention, there is provided a semiconductor device comprising a semiconductor substrate on which an elements layer is formed; a heat dissipating component provided on the semiconductor substrate; and a heat dissipation preventing component that is removable formed on the heat dissipating component so as to inhibit heat dissipation from the heat dissipating component.

According to the present invention, the heat dissipation preventing component inhibits heat dissipation from the heat dissipating component when mounting the semiconductor device on a substrate. Accordingly, a temperature of a substrate bonding material such as a solder ball can be raised to a sufficient level in a mounting process, and resultantly a desired mounting performance can be achieved with the semiconductor device. Also, since the heat dissipation preventing component can be removed after the mounting process, the semiconductor device can be obtained with a lower thermal resistance and an excellent heat dissipation characteristic.

According to the present invention, there is provided a method of manufacturing a semiconductor device including a semiconductor substrate on which an elements layer is provided and a heat dissipating component formed in this sequence, comprising forming a heat dissipation preventing component on the heat dissipating component with an adhesive before mounting the semiconductor device on a base material; and removing the heat dissipation preventing component from the heat dissipating component after mounting the semiconductor device on the base material.

In the present invention, the base material will also include a semiconductor wafer and a semiconductor chip, without limitation to a substrate.

According to the present invention, the heat dissipation preventing component located on the heat dissipating component inhibits heat dissipation from the heat dissipating component, when mounting the semiconductor device on the base material. Accordingly, a temperature of a base material bonding material such as a solder ball can be raised to a sufficient level in a mounting process, and resultantly a semiconductor device that achieves a desired mounting performance can be manufactured. Also, since the heat dissipation preventing component can be removed after the mounting process, the semiconductor device can be obtained with a lower thermal resistance and with an excellent heat dissipation characteristic.

According to the present invention, there is provided a method of manufacturing a semiconductor device including a semiconductor substrate on which an elements layer is formed and a heat dissipating component formed in this sequence, comprising forming concavities and convexities on the heat dissipating component and a heat dissipation preventing component; fitting the heat dissipating component and the heat dissipation preventing component before mounting the semiconductor device on a base material; and removing the heat dissipation preventing component from the heat dissipating component after mounting the semiconductor device on the base material.

According to the present invention, the heat dissipation preventing component located on the heat dissipating component inhibits heat dissipation from the heat dissipating component, when mounting the semiconductor device on the base material. Accordingly, a temperature of a base material bonding material can be raised to a sufficient level in a mounting process, and resultantly a semiconductor device that achieves a desired mounting performance can be manufactured. Also, the heat dissipation preventing component can be easily removed after mounting the semiconductor device on the base material. Consequently, the semiconductor device can be efficiently obtained with a lower thermal resistance and with an excellent heat dissipation characteristic.

According to the present invention, a heat dissipation preventing component is provided in a semiconductor device during a mounting process, and the heat dissipation preventing component is removed after the mounting process. Accordingly, a temperature of a semiconductor device bonding material can reach a sufficiently high level during the mounting process, to thereby achieve a desired mounting performance. Also, once the mounting has been carried out, the heat dissipation preventing component is removed. Consequently, a semiconductor device can be obtained that has a lower thermal resistance and has an excellent heat dissipation characteristic.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1A:
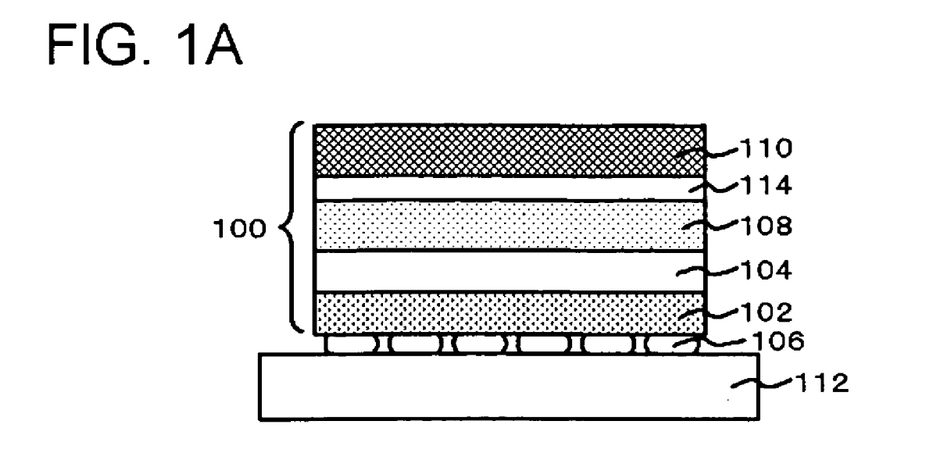
FIGS. 1A and 1B are schematic cross-sectional views showing a structure of a semiconductor device and a method of manufacturing the semiconductor device according to an embodiment of the present invention.

Referring first to FIG. 1A, a semiconductor device 100 is mounted on a substrate 112 with solder balls 106, and includes an elements layer (elements layer 102), a heat dissipating component (heat spreader 108) and a heat dissipation preventing component (low thermal conductivity plate 110) that is removable formed on the heat dissipating component and inhibits heat dissipation from the heat dissipating component.

From a different view point, FIG. 1A shows the semiconductor device 100 including a semiconductor substrate (silicon substrate 104) on which an elements layer (elements layer 102) is formed, a heat dissipating component (heat spreader 108) provided on the semiconductor substrate, and a heat dissipation preventing component (low thermal conductivity plate 110) that is removable formed on the heat dissipating component and inhibits heat dissipation from the heat dissipating component.

Since the heat dissipation preventing component is removed from the heat spreader after mounting the semiconductor device on the substrate, heat dissipation efficiency is fully secured in an actual use of the semiconductor device.

The heat dissipation preventing component may be fixed with an adhesive. Also, the heat dissipation preventing component may have a transmitting property of light, and an adhesive that softens through a reaction against a light may be employed. Such structure facilitates the removal of the heat dissipation preventing component after mounting the semiconductor device on the substrate, and also ensures a desired mounting performance of the semiconductor device. Here, the light may be an ultraviolet ray.

Also, the heat dissipation preventing component may be fixed by mutually fitting concavity and convexity formed on the heat spreader and the heat dissipation preventing component. Such structure facilitates the removal of the heat dissipation preventing component, and also ensures a desired mounting performance of the semiconductor device.

Also, since the heat dissipation preventing component is removed from the heat spreader after mounting the semiconductor device on a base material, a lower thermal resistance can be secured in an actual use of the semiconductor device, and consequently a semiconductor device having an excellent heat dissipation characteristic can be manufactured.

Hereunder, embodiments of the present invention will be described referring to the accompanying drawings. Here, throughout the drawings, similar constituents are given an identical numeral, and detailed description thereof will be omitted as the case may be. In addition, in the following passage describing the embodiments, a semiconductor package represents a practical example of the semiconductor device, and a heat spreader represents a practical example of the heat dissipating component.

FIRST EMBODIMENT

Figure 1B:
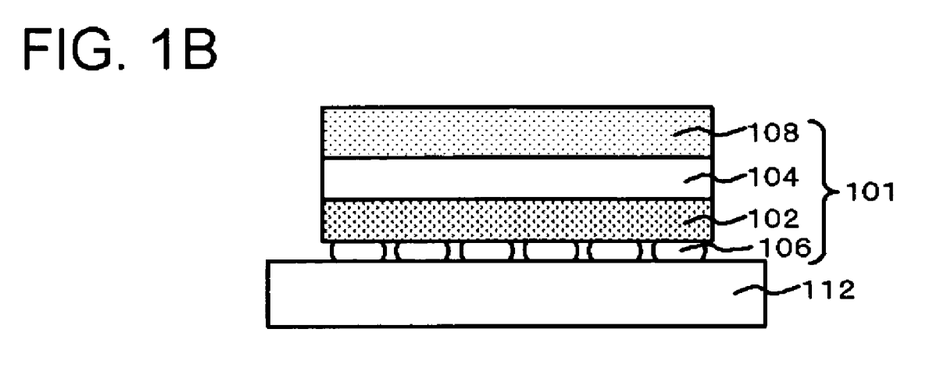

FIGS. 1A and 1B are schematic cross-sectional views showing a method of manufacturing a semiconductor package having a lowered thermal resistance, according to a first embodiment.

Referring first to FIG. 1A, a semiconductor package 100 includes an elements layer 102, a silicon substrate 104, solder balls 106, a heat spreader 108, and a low thermal conductivity plate 110. Here, the low thermal conductivity plate 110 corresponds to the heat dissipation preventing component for inhibiting heat dissipation from the heat spreader 108 during a reflow soldering process, which will be described later. The low thermal conductivity plate 110 may be constituted of a low thermal conductivity metal such as a Ni—Cr alloy, or a low thermal conductivity material such as a glass, a ceramic, a plastic and so forth. Also, a sheet-shaped material or a material having a high rigidity is preferably employed as the low thermal conductivity plate 110. The heat spreader 108 is formed so as to be in contact with the rear surface of the silicon substrate 104, that is, the upper surface of the silicon substrate 104 according to FIG. 1A. In addition, the heat spreader 108 may be a heat dissipating plate, or any other heat dissipating component which can provide a high heat dissipating effect. In the elements layer 102, active elements such as transistors and passive elements such as resistors and metal wire and the like are formed.

The low thermal conductivity plate 110 is fixed to the heat spreader 108 with an adhesive 114, a type of which is appropriately selected depending on a material constituting the heat spreader 108 and the low thermal conductivity plate 110. In FIG. 1A, it is indicated an example that the low thermal conductivity plate 110 is layered so as to cover an entire upper surface of the heat spreader 108.

Then the solder balls 106 formed on the lower surface of the semiconductor package 100 (that is, the lower surface of the elements layer 102 according to FIG. 1A) are bonded to a substrate 112, by a reflow process. Here, in the case where the solder balls 106 are constituted of a so-called lead-free solder, a preferable reflow temperature is in a range of 210 to 260 degree centigrade, in which 230 degree centigrade is more preferable.

Since the semiconductor package 100 is provided with the low thermal conductivity plate 110 covering an entire upper surface of the heat spreader 108, heat dissipation from the heat spreader 108 is inhibited, during the reflow process. Accordingly, sufficient heat is supplied to the solder balls 106, so that the solder balls 106 can be heated up to a desired temperature. As a result, the semiconductor package 100 and the substrate 112 are fully bonded via the solder balls 106, thus achieving a desired mounting performance of the semiconductor package 100 on the substrate 112.

Now referring to FIG. 1B, upon removing the low thermal conductivity plate 110 from the semiconductor package 100 after the reflow process, a semiconductor package 101 is obtained as a semiconductor package having a lowered thermal resistance and hence an excellent heat dissipation characteristic.

Figure 6A:
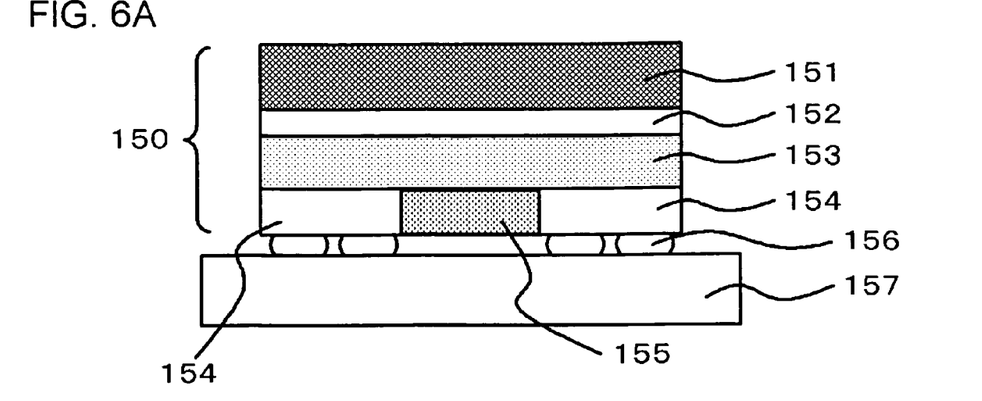
FIGS. 6A to 6B are schematic cross-sectional views showing a structure of a semiconductor device and a method of manufacturing the semiconductor device according to an embodiment of the present invention.

The first embodiment of the present invention may include a configuration as shown in FIG. 6A. Referring to FIG. 6A, a semiconductor device 150 according to this embodiment includes solder balls 156, a semiconductor package substrate 154, a heat spreader 153, a low thermal conductivity plate 151, and a semiconductor chip 155.

The low thermal conductivity plate 151 corresponds to the heat dissipation preventing component for inhibiting heat dissipation from the heat spreader 153 during a reflow soldering process, as described above. The heat dissipation preventing component may be constituted of a low thermal conductivity material, as in the foregoing case.

The semiconductor package substrate 154 is provided with an opening at a central portion thereof, in which the semiconductor chip 155 is disposed. Also, the semiconductor chip 155 is an element formed layer formed on a silicon substrate. An electrical connection (not shown in the drawings) between the semiconductor chip 155 and the semiconductor package substrate 154 may be made by any suitable method such as wire bonding or TAB lead. The semiconductor package substrate 154 includes therein an electrical connection layer (not shown in the drawings), for connection with an external component such as a substrate 157, via the solder balls 156.

The low thermal conductivity plate 151 is fixed to the heat spreader 153 with an adhesive 152. A kind of the adhesive may be appropriately selected as in the foregoing case.

On the semiconductor chip 155, the heat spreader 153 is disposed. Here, these components may be directly stuck to each other, or a component having a high thermal conductivity may be interposed therebetween. Also, the heat spreader 153 may be a heat dissipating plate, or any other heat dissipating component which can provide a high heat dissipating effect.

Figure 6B:
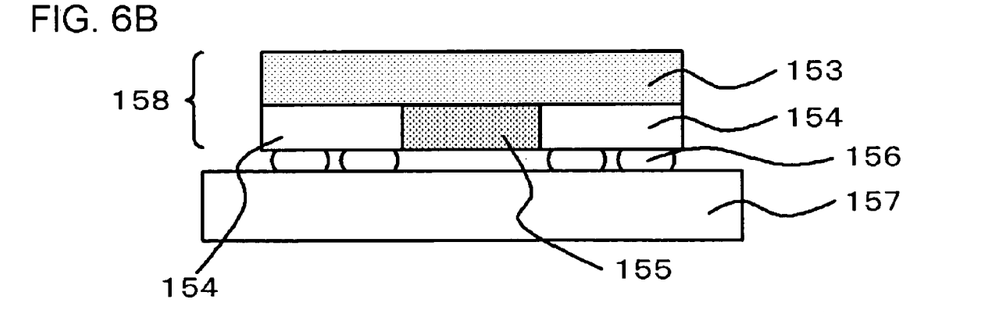

Then the solder balls 156 disposed on the lower surface of the semiconductor device 150 are bonded to the substrate 157 by a reflow process. Since the semiconductor device 150 is provided with the low thermal conductivity plate 151, heat dissipation from the heat spreader 153 is inhibited, during the reflow process. Accordingly, sufficient heat is supplied to the solder balls 156, so that the solder balls 156 can be heated up to a desired temperature. As a result, the semiconductor device 150 and the substrate 157 are fully bonded via the solder balls 156, thus achieving a desired mounting performance of the semiconductor device 150 on the substrate 157. Further, as shown in FIG. 6B, removing the low thermal conductivity plate 151 from the semiconductor device 150 after the reflow process allows utilizing the semiconductor device 150 as the semiconductor package 158 granted with a low thermal resistance.

Figure 7A:
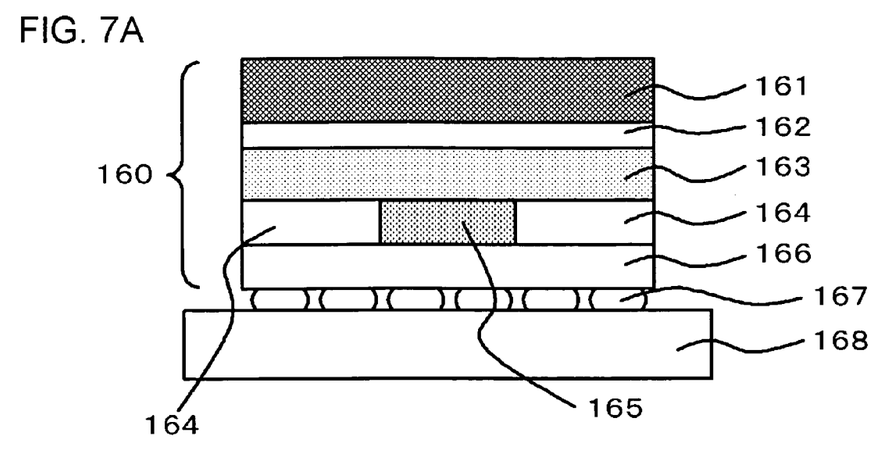
FIGS. 7A to 7B are schematic cross-sectional views showing a structure of a semiconductor device and a method of manufacturing the semiconductor device according to an embodiment of the present invention.

The first embodiment of the present invention may also include a configuration as shown in FIG. 7A.

Referring to FIG. 7A, a semiconductor device 160 includes solder balls 167, a semiconductor package substrate 166, a heat spreader 163, a low thermal conductivity plate 161, a semiconductor chip 165, and a reinforcing component 164.

The low thermal conductivity plate 161 is, as described above, the heat dissipation preventing component provided to inhibit heat dissipation from the heat spreader 163 during the reflow process.

The reinforcing component 164 is provided with an opening at a central portion thereof, in which the semiconductor chip 165 is disposed.

The semiconductor chip 165 is an elements layer formed on a semiconductor substrate. An electrical connection (not shown in the drawings) between the semiconductor chip 165 and the semiconductor package substrate 166 may be made by any suitable method such as wire bonding, TAB lead, or solder ball, without limitation to a bump bonding.

The semiconductor package substrate 166 includes therein an electrical connection layer (not shown in the drawings), for connection with an external component such as a substrate 168, via the solder balls 167. The low thermal conductivity plate 161 is fixed to the heat spreader 163 with an adhesive 162. A kind of the adhesive may be appropriately selected as in the foregoing case.

On the semiconductor chip 165, the heat spreader 163 is disposed. Here, these components may be directly stuck to each other, or a component having a high thermal conductivity may be interposed therebetween. Meanwhile, the advantageous effect attained by the configuration shown in FIG. 7A during a reflow soldering process, as well as the manufacturing process subsequent to the reflow process (FIG. 7B) are similar to those described with respect to FIGS. 6A and 6B. Accordingly, the description on this aspect is omitted.

As shown in FIGS. 1A, 6A, and 7A, a semiconductor device to be mounted on a substrate with solder balls, and which is provided with a heat dissipating component, can be constituted into the semiconductor device according to the foregoing embodiment, by providing a heat dissipation preventing component that is removable on the heat dissipating component so as to inhibit heat dissipation from the heat dissipating component. While the heat spreader or heat dissipating plate is employed as the heat dissipating component in the foregoing embodiment, the heat dissipating component may be of any material as long as it offers a high heat dissipating effect, according to the present invention.

Accordingly, the present invention also includes a conventional semiconductor package provided with a heat dissipating component to be mounted via solder balls on a substrate such as a printed circuit board, in which a low thermal conductivity plate is additionally provided on the heat dissipating component. Examples of such conventional semiconductor package include EBGA (Enhanced Ball Grid Array), FCBGA (Flip Chip Ball Grid Array) and so forth.

Figure 8:
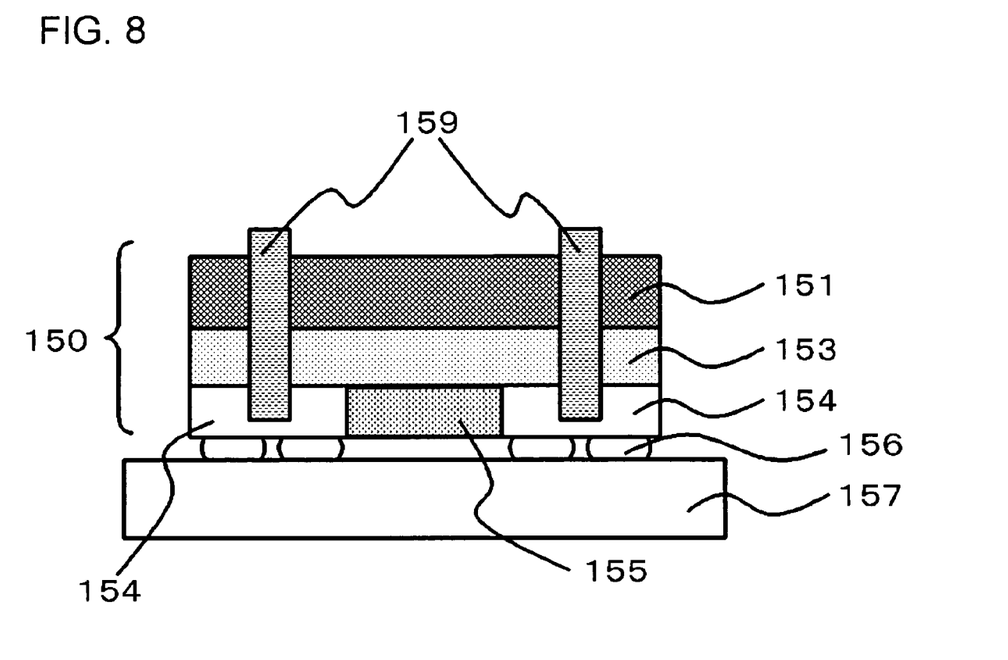
FIG. 8 is a schematic cross-sectional view showing a structure of a semiconductor device according to an embodiment of the present invention.
Figure 9:
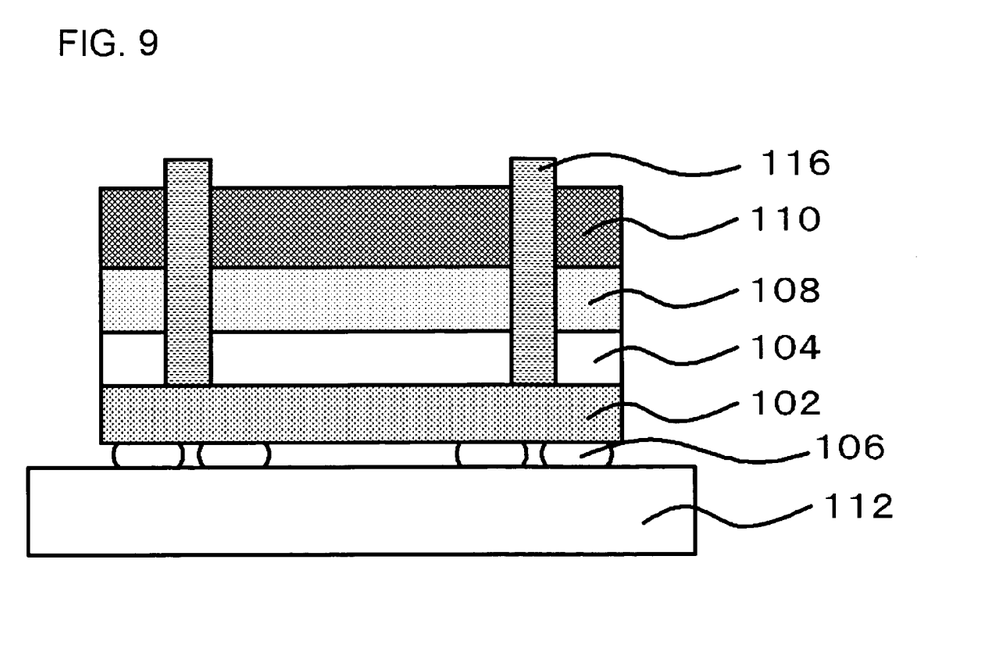
FIG. 9 is a schematic cross-sectional view showing a structure of a semiconductor device according to an embodiment of the present invention.

While the first embodiment represents a case where the low thermal conductivity plate 110 is adhered to the heat spreader 108 with an adhesive shown in FIG. 1A, the low thermal conductivity plate 110 may be joined to the heat spreader 108 with a fixing device such as a screw 116 as shown in FIG. 9, so that after completing the reflow process the screw 116 is removed to separate the low thermal conductivity plate 110 from the heat spreader 108. Alternatively, as shown in FIG. 8, a fixing device such as a screw may be employed in place of the adhesive 152, in the configuration described referring to FIG. 6A. In FIG. 8, the screw 159 penetrates the low thermal conductivity plate 151 and the heat spreader 153 to reach the semiconductor package substrate 154, while the screw 159 may only reach the heat spreader 153, provided that the low thermal conductivity plate 151 can be firmly fixed. In addition, though not shown in the drawings, a fixing device such as a screw may be employed in place of the adhesive 162, in the configuration described referring to FIG. 7A.

SECOND EMBODIMENT

Figure 2A:
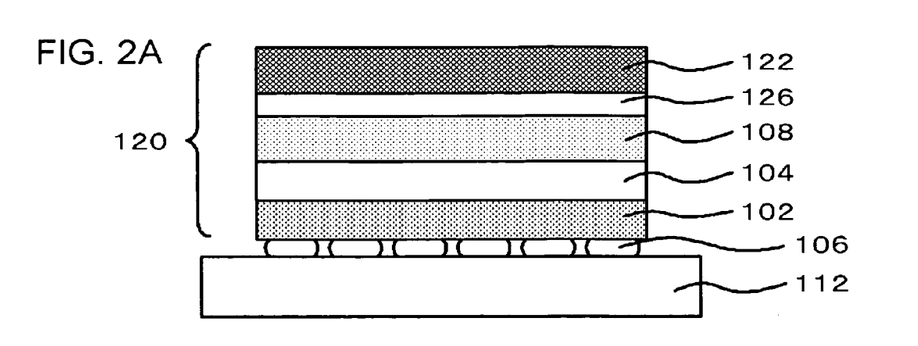
FIGS. 2A to 2C are schematic cross-sectional views showing a structure of a semiconductor device and a method of manufacturing the semiconductor device according to an embodiment of the present invention.
Figure 2B:
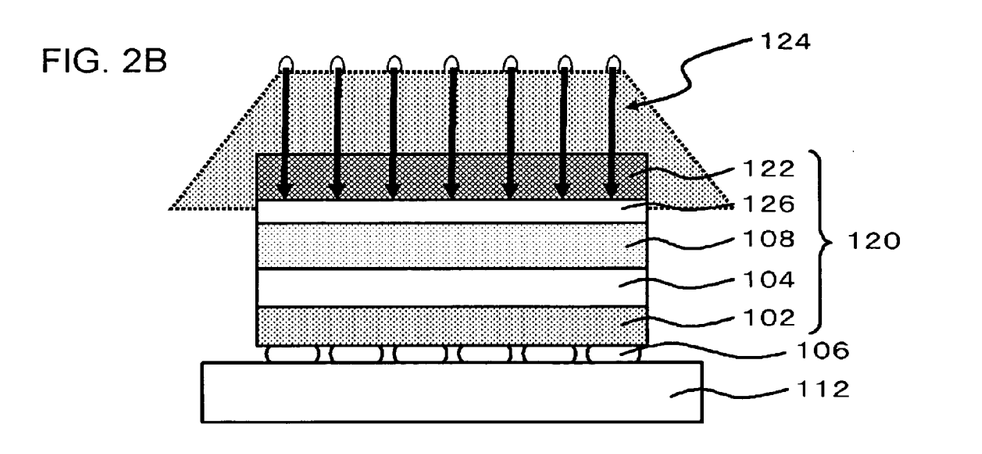
Figure 2C:
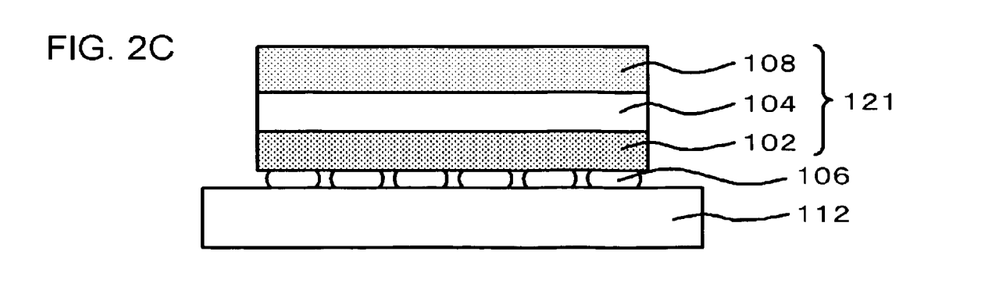

FIGS. 2A to 2C are schematic cross-sectional views for explaining a structure and manufacturing process of a semiconductor device according to this embodiment. FIG. 2A is a schematic cross-sectional view showing the semiconductor device according to this embodiment.

Referring to FIG. 2A, a semiconductor package 120 includes a low thermal conductivity plate 122 constituted of a material having high light-transmitting efficiency for a light 124 of a specific wavelength range, including a glass or a plastic such as acryl, and the low thermal conductivity plate 122 is fixed over an entire surface of the heat spreader 108 with a specific adhesive 126 that softens with the light 124.

The low thermal conductivity plate 122 may be constituted of a low thermal conductivity material such as a glass, a ceramic, a plastic and so forth. Also, a sheet-shaped material or a material having a high rigidity or the like is preferably employed as the low thermal conductivity plate 122.

As the light 124, for example an ultraviolet ray is preferably employed. Also, the specific adhesive 126 that softens with the light 124 may be one of those adhesives constituted of a resin material that softens with an ultraviolet ray (hereinafter referred to as a UV-softening adhesive).

Examples of a UV-softening adhesive include adhesives that have a bond which is cut by irradiation of an ultraviolet ray, such as —CH—, —CO— (ketone), —CONH— (amide), —NH— (imide), —COO— (ester), —N=N— (azo), —CH=N— (Schiff) and so forth. An adhesive predominantly containing such a bond is preferably employed, for example a polyolefin adhesive such as a polyethylene adhesive or a polypropylene adhesive, a polyimide adhesive, a polyester adhesive, a polymethylmethacrylate (PMMA) adhesive and so on. Also, just one or a combination of two or more of these materials may be employed.

Also, an adhesive containing aromatic hydrocarbons (one or a plurality of benzene rings, or a fused ring thereof) in its structural formula may be employed. For example, it is preferable to employ an adhesive of a polyphenylenesulfide (PPS) adhesive, or of a polyethersulfone (PES) adhesive. Also, just one or a combination of two or more of these materials may be employed.

Here, in the case where an adhesive 126 described above, the low thermal conductivity plate 122 can be easily separated from the heat spreader 108 after the reflow process, by irradiating an ultraviolet ray as shown in FIG. 2B through the low thermal conductivity plate 122 constituted of a material having a high transmission characteristic for the ultraviolet ray, to a bonding interface between the low thermal conductivity plate 122 and the heat spreader 108, where the adhesive 126 is used. As a result, a semiconductor package 121 is obtained as a semiconductor device having an excellent heat dissipation characteristic (FIG. 2C).

Since the semiconductor package 120 is provided with the low thermal conductivity plate 122 so as to cover an entire surface of the heat spreader 108, heat dissipation from the heat spreader 108 is inhibited, during the reflow process. Accordingly, sufficient heat is transmitted to the solder balls 106, so that the solder balls 106 can be heated up to a desired temperature.

As a result, besides that the low thermal conductivity plate 122 can be easily removed after the reflow process, the semiconductor package 120 and the substrate 112 are fully bonded via the solder balls 106, thus achieving a desired mounting performance of the semiconductor package 120 on the substrate 112.

THIRD EMBODIMENT

Figure 3:
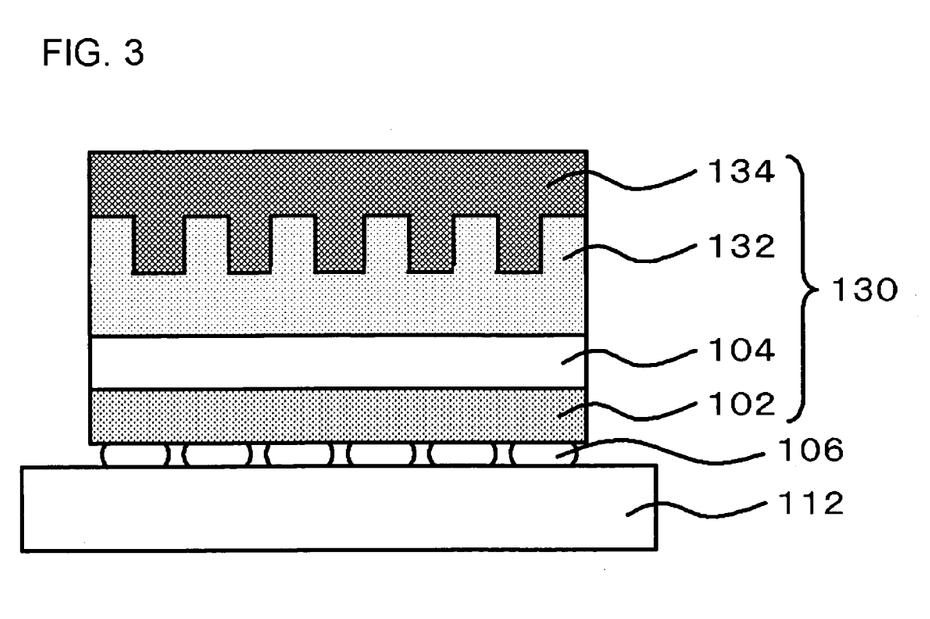
FIG. 3 is a schematic cross-sectional view showing a structure of a semiconductor device according to an embodiment of the present invention.

FIG. 3 is a schematic cross-sectional view showing a structure of a semiconductor device, according to a third embodiment.

On a semiconductor package 130, a heat spreader 132 formed with concavity and convexity of a predetermined shape, and a low thermal conductivity plate 134 formed with similar concavity and convexity that fit those of the heat spreader 132, are joined in compliance with the given shape. For the combination, it is preferable to combine those which fit best based on a dimensional tolerance, to mechanically fix with a screw or the like, or to adhere with an adhesive, among which fitting based on a dimensional tolerance is particularly preferable.

Because of the concavity and convexity formed on the heat spreader 132 and the low thermal conductivity plate 134, a surface area of a contact interface between the heat spreader 132 and the low thermal conductivity plate 134 is increased. Accordingly, adherence of the heat spreader 132 and the low thermal conductivity plate 134 becomes tighter during the reflow process, thereby further reducing likelihood of separation of the low thermal conductivity plate 134 from the heat spreader 132 during the reflow process.

In the case where the heat spreader 132 and the low thermal conductivity plate 134 are fitted based on a dimensional tolerance, the heat spreader 132 and the low thermal conductivity plate 134 can be easily separated from each other after the reflow process, without damaging or affecting the semiconductor package.

Since the semiconductor package 130 is provided with the low thermal conductivity plate 134 so as to cover an entire surface of the heat spreader 132, heat dissipation from the heat spreader 132 is inhibited, during the reflow process. Accordingly, sufficient heat is transmitted to the solder balls 106, so that the solder balls 106 can be heated up to a desired temperature.

As a result, besides that the low thermal conductivity plate 134 can be easily removed after the reflow process, the semiconductor package 130 and the substrate 112 are fully bonded via the solder balls 106, thus achieving a desired mounting performance of the semiconductor package 130 on the substrate 112. Also, a semiconductor device having an excellent heat dissipation characteristic is obtained.

Although the present invention has been described referring to the preferable embodiment, it is apparent to those skilled in the art that the embodiment is only exemplary, and that various modifications may be made without departing from the scope of the present invention.

Figure 4:
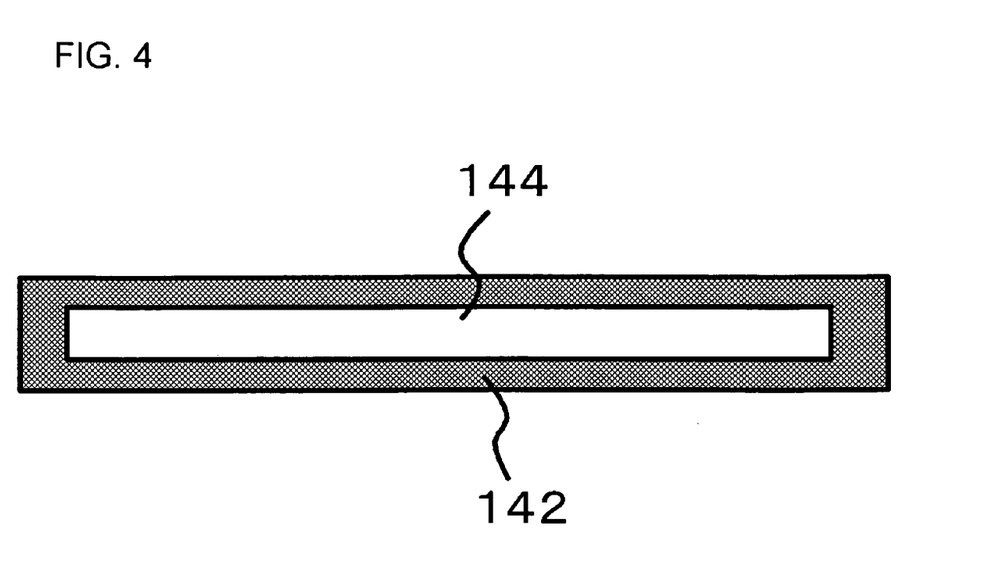
FIG. 4 is a schematic cross-sectional view showing a structure of a semiconductor device according to an embodiment of the present invention.

To cite a few examples, while the low thermal conductivity plate is constituted of a one-piece plate shaped low thermal conductivity material in the foregoing embodiments, the low thermal conductivity plate may be a hollow plate as shown in FIG. 4, with its outer shell 142 constituted of a different material from a the low thermal conductivity material, but with its hollow portion 144 filled with a low thermal conductivity liquid or a low thermal conductivity gas. Here, the outer shell 142 may also be constituted of a low thermal conductivity material.

Figure 5:
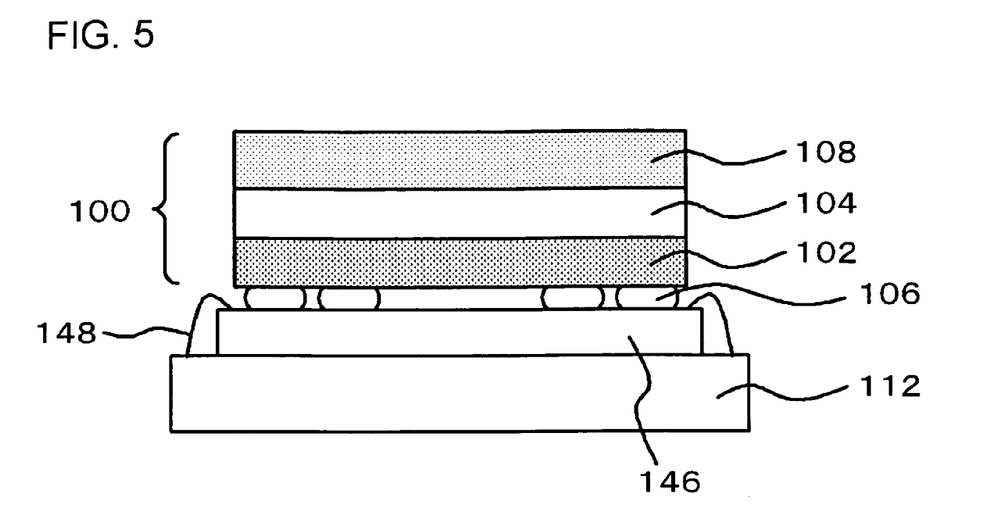
FIG. 5 is a schematic cross-sectional view showing a structure of a semiconductor device according to an embodiment of the present invention.

Also, the foregoing embodiment describes a case where a semiconductor package is mounted on a substrate, while the semiconductor package may be mounted on the semiconductor chip 146 as shown in FIG. 5. In FIG. 5, a semiconductor chip 146 and another semiconductor chip including an elements layer 102 and a silicon substrate 104 are connected to a substrate 112 via solder balls 106. A wire bonding 148 serves to electrically connect the semiconductor chip 146 and the substrate 112.

Further, while an ultraviolet ray is employed as a light 124 that has a specific wavelength range, and a UV-softening adhesive is employed as a specific adhesive that softens with a light of a specific wavelength in one of the foregoing embodiments, a different adhesive may be employed as long as the adhesive contains a resin material that softens when irradiated by a light containing a specific wavelength range, instead of the UV-softening adhesive, in which case a light of such specific wavelength may be employed.

Further, while a screw 159 is employed as a fixing device in the foregoing embodiments as shown in FIG. 8, any other device such as a pin may be employed instead of the screw 159, as long as that device can mechanically fix the low thermal conductivity plate 151 to the heat spreader 153. In addition, as shown in FIG. 9, a screw 116 may be employed to screw-fix to the silicon substrate 104.

Figure 7B:
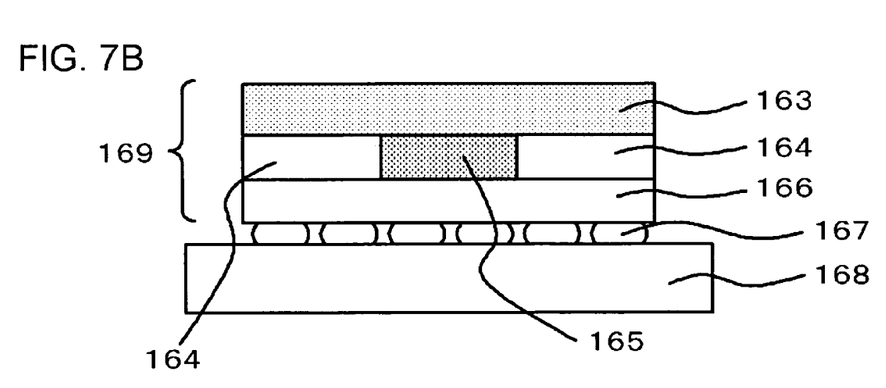

Still further, while the first embodiment represents a case where a low thermal conductivity component is formed with an adhesive as shown in FIG. 1A, to the semiconductor package shown in FIG. 6B or 7B, the configuration shown in FIG. 6B or FIG. 7B may be employed to constitute the semiconductor package described according to the second embodiment and the third embodiment. Also, without limitation to a semiconductor package having a configuration shown in FIGS. 6B and 7B, the present invention is conducted, in a semiconductor device to be mounted on a substrate with solder balls, and which is provided with a heat dissipating component, can be constituted into the semiconductor device according to the present invention, by providing a heat dissipation preventing component on the heat dissipating component as described In the foregoing embodiment so as to inhibit heat dissipation from the heat dissipating component.

Still further, while the foregoing embodiments represent a case where the low thermal conductivity plate 110 covers an entire upper surface of the heat spreader 108, the low thermal conductivity plate 110 may cover a portion of the upper surface of the heat spreader 108.

While a low thermal conductivity plate is employed as the heat dissipation preventing component in the foregoing embodiment, the plate shape is not the only example. The heat dissipation preventing component may be of any shape such as a film, as long as it is removable and has a low thermal conductivity.

It is apparent that the present invention is not limited to the above embodiment, that may be modified and changed without departing from the scope and spirit of the invention.

What is claimed is:

1. A method of manufacturing a semiconductor device including a semiconductor substrate on which an elements layer and a heat dissipating component are formed, comprising:

forming a heat dissipation preventing component on said heat dissipating component with an adhesive before mounting said semiconductor device on a base material; and removing said heat dissipation preventing component from said heat dissipating component after mounting said semiconductor device on said base material, wherein the heat dissipation preventing component is formed on said heat dissipating component with an adhesive before mounting said semiconductor device on a base material such that the heat dissipation preventing component inhibits heat dissipation from the heat dissipation component when it receives heat during the mounting of said semiconductor device on said base material.

2. A method of manufacturing a semiconductor device including a semiconductor substrate formed on an elements formed layer and a heat dissipating component formed over said semiconductor substrate, comprising:

forming a heat dissipation preventing component over said heat dissipating component with an adhesive before mounting said semiconductor device on a base material; and removing said heat dissipation preventing component from said heat dissipating component after mounting said semiconductor device on said base material, wherein the heat dissipation preventing component is formed over said heat dissipating component with an adhesive before mounting said semiconductor device on a base material such that the heat dissipation preventing component inhibits heat dissipation from the heat dissipation component when it receives heat during the mounting of said semiconductor device on said base material.

* * * * *